(12) United States Patent
Kunleda et al.

(10) Patent No.: US 7,116,730 B2
(45) Date of Patent: Oct. 3, 2006

(54) DEMODULATION APPARATUS

(75) Inventors: Yoshinori Kunleda, Kanagawa (JP); Kazuo Tomida, Tokyo (JP); Hidekuni Yomo, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 756 days.

(21) Appl. No.: 10/394,346

(22) Filed: Mar. 21, 2003

(65) Prior Publication Data
US 2003/0142763 A1 Jul. 31, 2003

Related U.S. Application Data

(63) Continuation-in-part of application No. 09/852,240, filed on May 9, 2001, now Pat. No. 6,593,805.

(30) Foreign Application Priority Data

| May 9, 2000 | (JP) | ............... 2000-135702 |
| Feb. 27, 2001 | (JP) | ............... 2001-051830 |
| Apr. 26, 2001 | (JP) | ............... 2001-128906 |

(51) Int. Cl.
*H04L 27/14* (2006.01)

(52) U.S. Cl. ............... 375/324; 375/340; 375/350

(58) Field of Classification Search ........ 375/259–261, 375/285, 316, 324, 340, 343, 346, 349, 350; 708/300, 301, 319, 322; 329/304, 306, 315, 329/323, 345–347, 358; 455/296, 307
See application file for complete search history.

(56) References Cited

U.S. PATENT DOCUMENTS

| 4,910,468 A | 3/1990 | Ohtsuka et al. |
| 5,068,667 A | 11/1991 | Mizoguchi |
| 5,524,125 A | 6/1996 | Tsujimoto |
| 6,819,911 B1 * | 11/2004 | Clelland et al. ............ 455/296 |
| 6,993,311 B1 * | 1/2006 | Li et al. ..................... 455/307 |

FOREIGN PATENT DOCUMENTS

| JP | 05-260108 | 10/1993 |
| JP | 06-260887 | 9/1994 |
| JP | 11-004272 | 1/1999 |

* cited by examiner

Primary Examiner—Dac V. Ha
(74) Attorney, Agent, or Firm—RatnerPrestia

(57) ABSTRACT

A demodulation apparatus includes an A/D converter for sampling and quantizing a baseband signal, and a demultiplexer for multiple-separating output signals of the A/D converter into two outputs. A first branch unit splits one of the two outputs of the demultiplexer into M outputs, where M is an integer equal to or greater than 2. Also, M/2 delay units delay M/2 outputs of the first branch unit. A second branch unit splits the outputs of the demultiplexer into M. The demodulation apparatus further includes first M/2 transversal filters, second M/2 transversal filters, and third M transversal filters. First M/2 adders each adds one of the output signals of the first transversal filters and one of the output signals of the third transversal filters, and second M/2 adders each adds one of the output signals of the second transversal filters and one of the output signals of the third transversal filters. A parallel-structured decision point determination unit selects one output from respective outputs of the first M/2 adders and the second M/2 adders. A selector outputs only the output of the adder that is selected by the parallel-structured decision point determination unit, and a decision unit makes a decision based on the output of the selector.

2 Claims, 18 Drawing Sheets

DEMODULATION APPARATUS

This Application is a continuation-in-part of U.S. patent application Ser. No. 09/852,240, filed May 9, 2001, now U.S. Pat. No. 6,593,805.

FIELD OF THE INVENTION

The present invention relates to a demodulation apparatus for use in a digital transmission unit.

BACKGROUND OF THE INVENTION

Conventional demodulation of an input modulated wave in a digital transmission unit is performed in the following way. An analog-to-digital (A/D) converter samples an analog baseband signal at a rate higher than a symbol rate (originally, a transmission rate of digital data), that is, a sampling frequency approximately sixteen times as high as the symbol rate to convert it into a digital signal. To restore the symbol rate, time-positions to be decided are estimated, and the signal is then decimated. The signal further undergoes frequency error estimation, data decision and the others. It should be noted that there are cases where a digital filter, a phase converter or a delay detector is provided at the subsequent stage of the A/D converter.

In the above case, the sampling frequency needs to be kept high for the estimation of the time-positions to be decided, so that a demodulation apparatus needs to be operated at an increased frequency. Consequently, the demodulation apparatus can hardly be implemented in an integrated circuit (IC) utilizing a generalized process or the like.

Moreover, with an increased occupied bandwidth of the signal received or the like, a frequency response and the others of the A/D converter are requested more strictly than ever.

There is one method known as a solution to the above problems. According to this method, an interpolator is provided at the subsequent stage of the A/D converter. Data undergo interpolation after sampling performed by the A/D converter so as to be reproduced through upsampling. The interpolation is done by inserting one data "0" or data "0" to the number of a given number into a string of data that is converted into the digital signal by the A/D converter.

According to the above method, the sampling frequency can be equal to or higher than the Nyquist frequency covering a frequency band of the input signal, thereby alleviating the requests to the A/D converter. However, the interpolation eventually requires a high-rate operation, and the frequency at which the demodulation apparatus is operated cannot thus be reduced. Accordingly, there is no choice but to increase a clock frequency required for oversampling or upsampling, and this circuit is thus hardly implemented in the IC utilizing the generalized process or the like.

SUMMARY OF THE INVENTION

The present invention addresses the problems discussed above and aims to reduce a frequency required for the operation of a demodulation apparatus.

The present invention relates to a demodulation apparatus including a A/D converter for sampling and quantizing a baseband signal, and a demultiplexer for multiple-separating output signals of the A/D converter into two outputs. A first branch unit splits one of the two outputs of the demultiplexer into M outputs, where M is an integer equal to or greater than 2, and M/2 delay units delay M/2 outputs of the first branch unit. A second branch unit splits the other outputs of the demultiplexer into M. The demodulator apparatus also includes first M/2 transversal filters, second M/2 transversal filters, and third M transversal filters. The first M/2 transversal filters receive each output of the first branch unit. The second M/2 transversal filters receive an output of each of the M/2 delay units. And the third M transversal filters receive each output of the second branch unit. First M/2 adders add one of the output signals of the first transversal filters and one of the output signals of the third transversal filters. Second M/2 adders add each of the output signals of the second transversal filters and one of the output signals of the third transversal filters. A parallel-structured decision point determination unit selects one output from respective outputs of the first M/2 adders and second M/2 adders. A selector outputs only the output of the adder that is selected by the parallel-structured decision point determination unit to a subsequent stage, and a decision unit makes a decision on the output of the selector.

DESCRIPTION OF THE PREFERRED EMBODIMENTS

Exemplary embodiments of the present invention are demonstrated hereinafter with reference to the accompanying drawings.

Exemplary Embodiment 1

Figure 1:
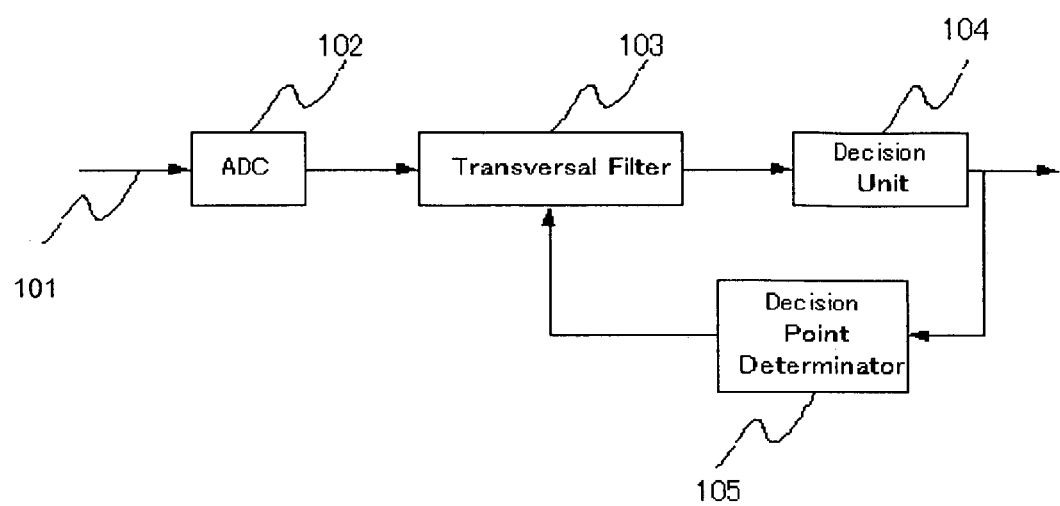
FIG. 1 is a block diagram of a demodulation apparatus in accordance with a first exemplary embodiment of the present invention.

FIG. 1 is a block diagram in accordance with the first exemplary embodiment of the present invention. Modulated wave 101 converted into a baseband undergoes sampling at a sampling frequency equal to or higher than the Nyquist frequency covering a frequency band of wave 101 and quantisation in A/D converter 102 and is passed through transversal filter 103 having time-shifted tap coefficients which designate decision points on the time axis, respectively. An output of filter 103 undergoes frequency error estimation, data decision and the others in decision unit 104. Decision point estimation unit 105 estimates a decision point based on information output from decision unit 104 and instructs filter 103 to select the tap coefficient designating the decision point.

An example of the use of interpolation done by insertion of "0" is explained hereinafter to facilitate the understanding of the principle of decision performed by transversal filter 103 of the present invention. It should be noted that the interpolation done by the insertion of "0" is not actually performed in the present invention (described later).

Figure 2:
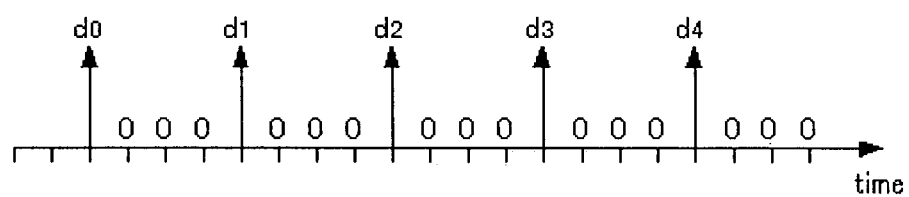
FIG. 2 is a conceptual drawing of a data string for explaining the principle of the present invention.

FIG. 2 shows data "0" inserted into a string of data d0, d1, d2, d3, d4 . . . , which is converted into a digital signal by A/D converter 102, for interpolation. Here, three data "0" are inserted into the string of input data d0, d1, d2, d3, d4 . . . . From the viewpoint of the frequency, aliasing of the original sampling frequency is also stored. To remove the aliasing, the signal input is low pass filtered by a low pass filter (LPF). In cases where the signal needs to undergo a waveform shaping filter, the waveform shaping can be carried out simultaneously with the low pass filtering.

Figure 3:
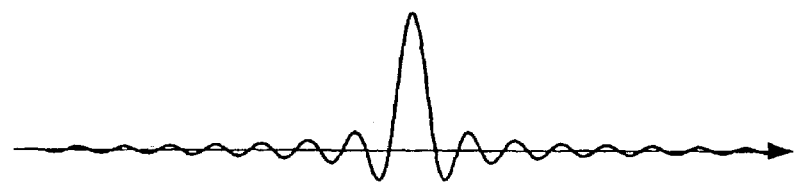
FIG. 3 is a conceptual drawing of an impulse of a low pass filter for explaining the principle of the present invention.

The low pass filtering is done by convolution of the data with an impulse of the LPF. FIG. 3 is a conceptual drawing of the impulse.

Figure 4:
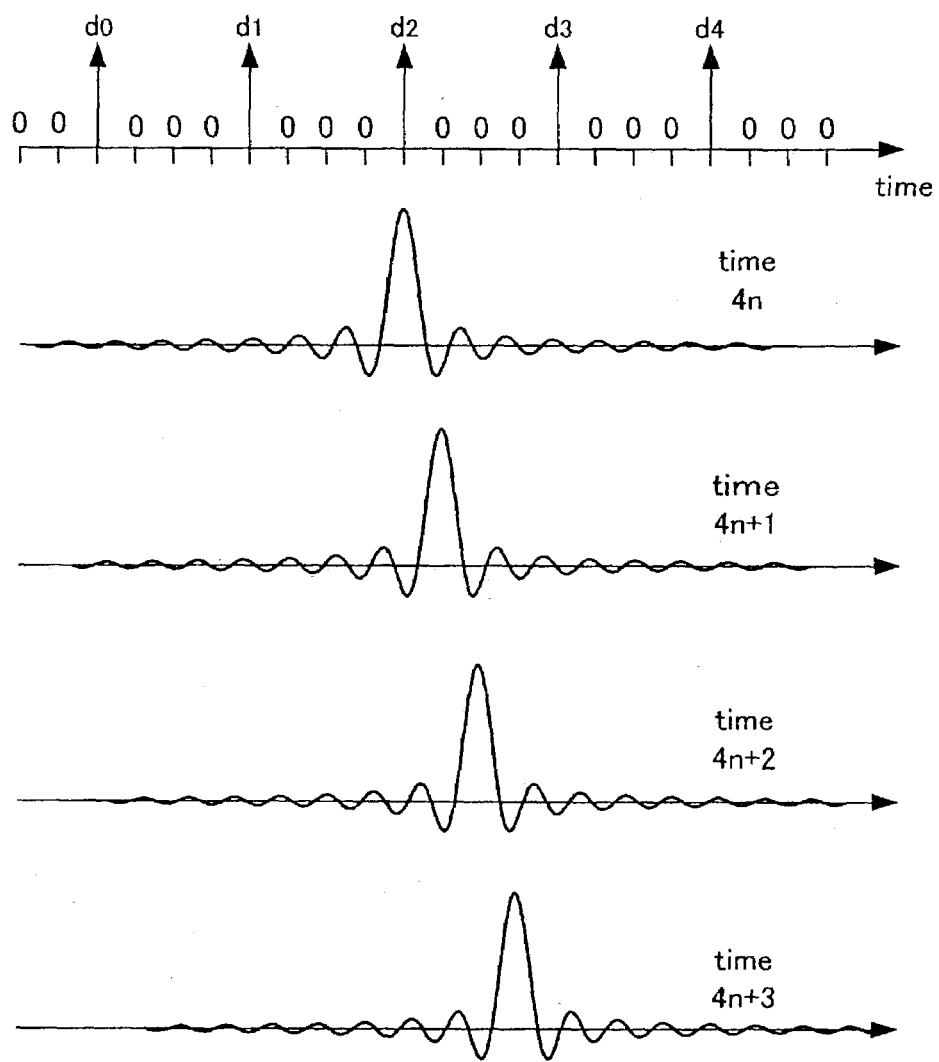
FIG. 4 is a conceptual drawing of a time relationship between the data string and impulses for explaining the principle of the present invention.

The convolution is performed on the data string after the insertion of "0". Its detail is explained with reference to FIG. 4 where the three "0"s are inserted (see FIG. 2). Assuming that n is an arbitrary integer and sampling data dn is in line with the center of an impulse at time 4n, data d2 is convolved with impulse p2 at time 4n. Similarly, at times 4n+1, 4n+2 and 4n+3, the "0"s inserted behind d2 in succession are convolved with impulses p2+1, p2+2 and p2+3, respectively.

Figure 5:
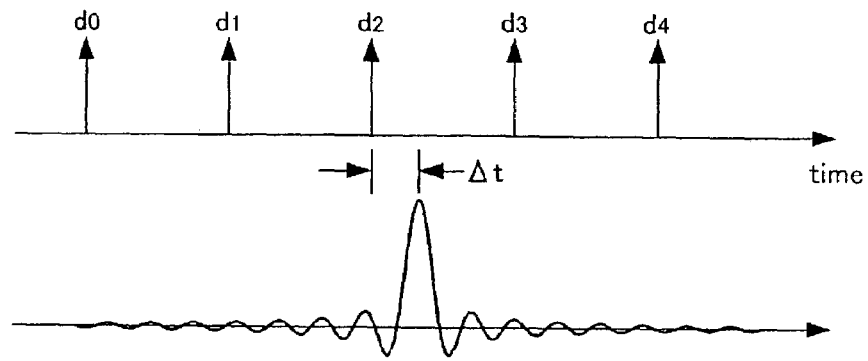
FIG. 5 is a conceptual drawing for illustrating convolution performed in the present invention.

As is clear from the above explanation, since sampling data dn which undergoes the convolution is positioned only in a specified place, the impulse shifted in time with respect to data dn free of "0" is presumably convolved at each time (see FIG. 5). Focusing attention on this point, the present invention utilizes a time shift of the impulse with respect to the data string for the convolution without inserting "0". In other words, the impulse shifted in time with respect to data dn free of "0" is utilized for the convolution at each time because, as shown in FIG. 5, sampling data dn which undergoes the convolution is positioned only in a specified place, so that the insertion of "0" need not be actually performed.

The convolution of the time-shifted impulses corresponds to sampling at a high sampling frequency, so that to restore the original sampling frequency, that is, a symbol rate, the signal requires decimation. The decimation corresponds to selecting one impulse that is shifted in time. Therefore, if how much time shifts is detected for the decimation, as shown in FIG. 5, an impulse time shifted by $\Delta t$ is prepared beforehand and then convolved; this is equivalent to sampling at the original sampling frequency, so that the decimation is unnecessary.

Transversal filter 103 is a transversal filter having the tap coefficients where the time-shifted impulses correspond to respective timings of the sampling data, respectively. Thus, the insertion of "0" that requires high-rate operation is unnecessary, the LPF can be simplified, and filter 103 can be operated at the same frequency as that of A/D converter 102.

Each of the tap coefficients of filter 103 can be prepared and selected by a read only memory (ROM) according to the time shift of required accuracy. Instead of the ROM, a digital signal processor (DSP) or the like can be used to determine which of the tap coefficients should be selected.

There is no limitation on the operation of decision point estimation unit 105. Estimation unit 105 may estimate the decision point through enveloped square-law detection or the use of a phase component of a pilot signal.

Exemplary Embodiment 2

Figure 6:
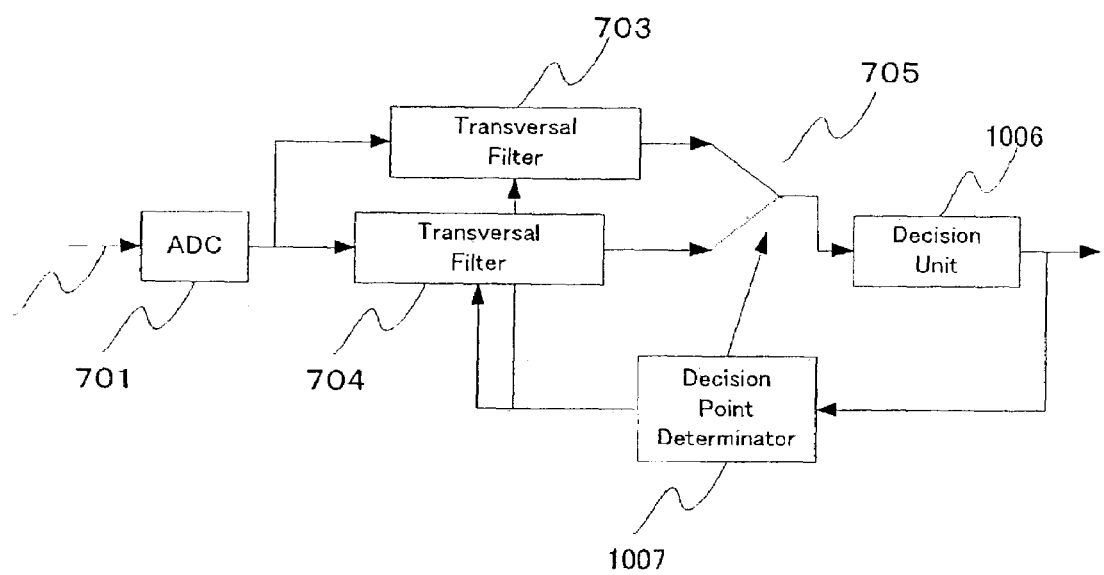
FIG. 6 is a block diagram of a demodulation apparatus in accordance with a second exemplary embodiment of the present invention.

FIG. 6 is a block diagram in accordance with the second exemplary embodiment of the present invention. Modulated wave 701 converted into a baseband undergoes sampling at a sampling frequency equal to or higher than the Nyquist frequency covering a frequency band of wave 701 and quantisation in A/D converter 702 and is passed through transversal filters 703, 704. Selector 705 selects one output from respective outputs of filters 703, 704, and the output selected undergoes frequency error estimation, data decision and the others in decision unit 706. Decision point estimation unit 707 estimates a decision point based on information output from decision unit 706 and instructs filters 703, 704 to respectively prepare tap coefficients each designating the decision point, and selector 705 selects one effective output from respective outputs of filters 703, 704.

Only a part of the operation of a demodulation apparatus that is different from that of the first exemplary embodiment is explained next. There are cases where transversal filter 103 of FIG. 1 does not produce the output while switching to the tap coefficient desired and until its result is reflected. In cases where this is undesirable, as shown in FIG. 6, two transversal filters 703, 704 are prepared. While selector 705 selects filter 703, filter 704 switches to a tap coefficient desired, and upon completion of the processing performed by filter 703, selector 705 selects filter 704. The output thus comes from either filter 703 or filter 704 at all times and is always guaranteed.

Exemplary Embodiment 3

Figure 7:
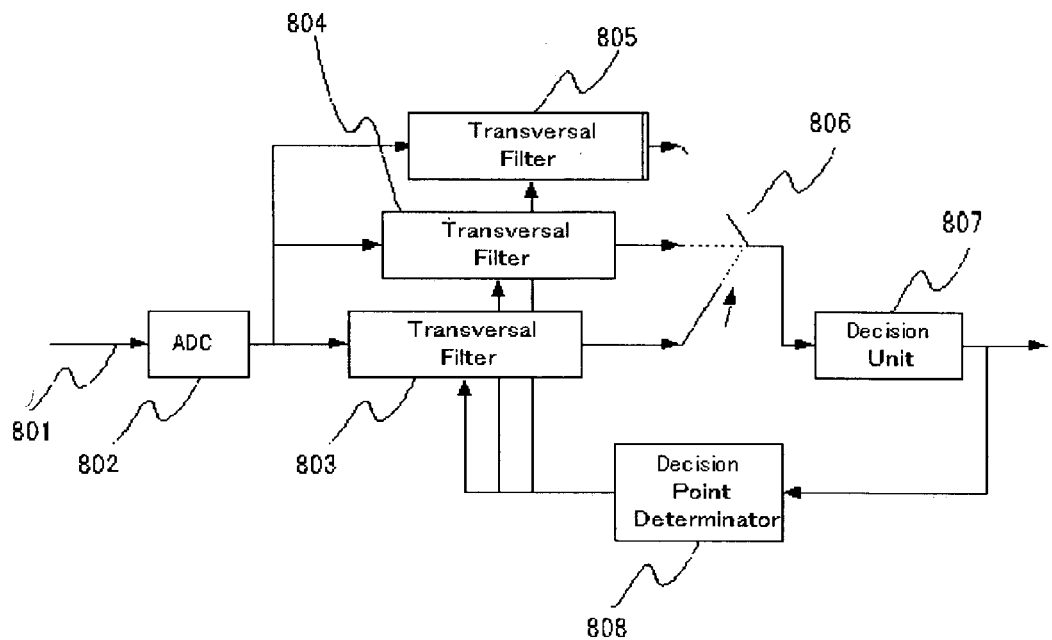
FIG. 7 is a block diagram of a demodulation apparatus in accordance with a third exemplary embodiment of the present invention.

FIG. 7 is a block diagram in accordance with the third exemplary embodiment of the present invention. Modulated wave 801 converted into a baseband undergoes sampling at a sampling frequency equal to or higher than the Nyquist frequency covering a frequency band of wave 801 and quantisation in A/D converter 802 and is passed through transversal filters 803, 804, 805. Selector 806 selects one output from respective outputs of filters 803, 804, 805, and the output selected undergoes frequency error estimation, data decision and the others in decision unit 807.

Decision point estimation unit 808 estimates a decision point based on information output from decision unit 807 and instructs filters 803, 804, 805 to respectively prepare tap coefficients each designating the decision point, and selector 806 selects one effective output from respective outputs of filters 803, 804, 805.

Only a part of the operation of a demodulation apparatus that is different from that of the second exemplary embodiment is explained next. FIG. 6 is based on the assumption that the selection of the tap coefficient is made according to the decision point arbitrarily set. However, it is common practice to make fine backward-and-forward adjustments of the decision point in demodulation. Accordingly, tap coefficients which are time shifted forward and backward with respect to the time of the transversal filter selected are respectively prepared in the other transversal filters which are not selected by selector 806. For example, in cases where transversal filter 803 is selected by selector 806, a tap coefficient time shifted slightly backward is prepared in transversal filter 804, while a tap coefficient time shifted slightly forward is prepared in transversal filter 805. When selector 806 selects filter 804 to shift the time slightly backward, the tap coefficient of filter 803 is unchanged, so that it becomes as if it shifts forward with respect to filter 804 selected. On the other hand, filter 805 switches to a tap coefficient shifted backward with respect to filter 804 selected. The backward-and-forward time shift can thus be performed smoothly at all times by changing the tap coefficient of one of the transversal filters.

The width of the forward-and-backward time shift may be fixed. The forward-and-backward time shift may be widened when accuracy of the decision point is poor and may be changed to shorten when accuracy of the decision point increases.

Exemplary Embodiment 4

Figure 8:
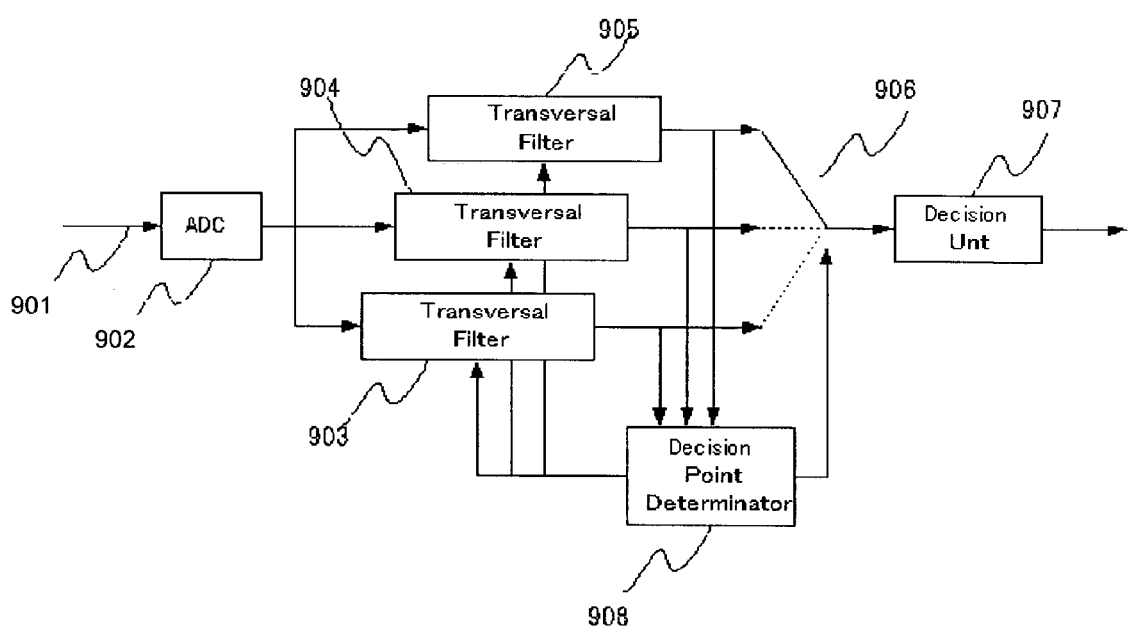
FIG. 8 is a block diagram of a demodulation apparatus in accordance with a fourth exemplary embodiment of the present invention.

FIG. 8 is a block diagram in accordance with the fourth exemplary embodiment of the present invention. Modulated wave 901 converted into a baseband undergoes sampling at a sampling frequency equal to or higher than the Nyquist frequency covering a frequency band of wave 901 and quantisation in A/D converter 902 and is passed through transversal filters 903, 904, 905. Selector 906 selects one output from respective outputs of filters 903, 904, 905, and the output selected undergoes frequency error estimation, data decision and the others in decision unit 907.

Decision point estimation unit 908 estimates a decision point based on the respective outputs of filters 903, 904, 905 and instructs filters 903, 904, 905 to respectively prepare tap coefficients each designating the decision point, and selector 906 selects one effective output from respective outputs of filters 903, 904, 905.

Only a part of the operation of a demodulation apparatus different from that of the third exemplary embodiment is explained next. Decision point estimation unit 908 estimates the decision point by utilizing the respective outputs of filters 903, 904, 905 before these outputs undergo selector 906.

Exemplary Embodiment 5

Figure 9:
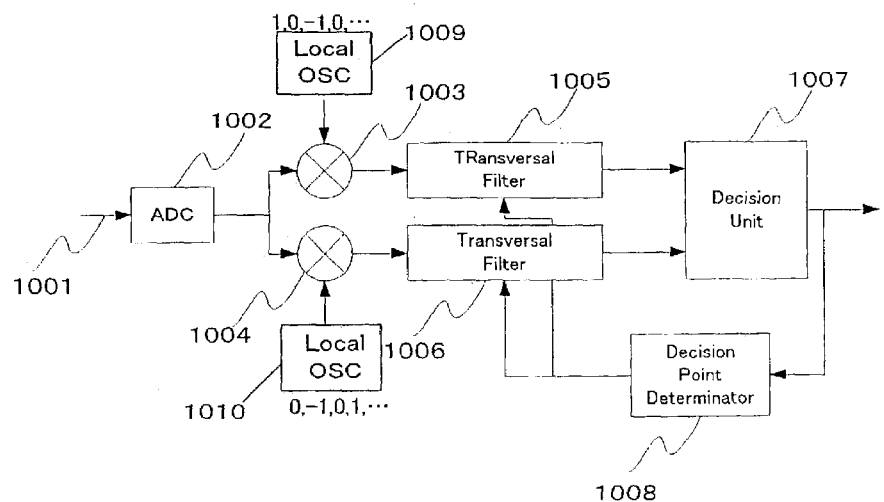
FIG. 9 is a block diagram of a demodulation apparatus in accordance with a fifth exemplary embodiment of the present invention.

FIG. 9 is a block diagram in accordance with the fifth embodiment of the present invention. Modulated wave 1001 having an intermediate frequency band, the center frequency of which is a quarter of a sampling frequency (described later), undergoes sampling at the sampling frequency two or more times as high as the Nyquist frequency covering the frequency band of wave 1001 when wave 1001 is converted into a baseband and quantisation in A/D converter 1002 and is split into an in-phase (I) signal and a quadrature (Q) signal. The signals are multiplied by respective signals from digital local oscillators 1009, 1010, respectively in multipliers 1003, 1004, respectively. Respective outputs of multipliers 1003, 1004 are passed through transversal filters 1005, 1006, respectively and undergo frequency error estimation, data decision and the others in decision unit 1007. Decision point estimation unit 1008 estimates a decision point based on information output from decision unit 1007 and instructs filters 1005, 1006 to respectively prepare tap coefficients each designating the decision point.

The signals of digital local oscillators 1009, 1010 become simply factors when the center frequency is a quarter of the sampling frequency as mentioned above and are a repetition of 1, 0, −1, 0 with respect to the I signal and a repetition of 0, −1, 0, 1 with respect to the Q signal. In the case of other frequencies, a digital direct synthesizer or the like is applied to the local oscillator.

The signals input to transversal filters 1005, 1006 are of the sampling frequency two or more times as high as the Nyquist frequency.

Figure 10:
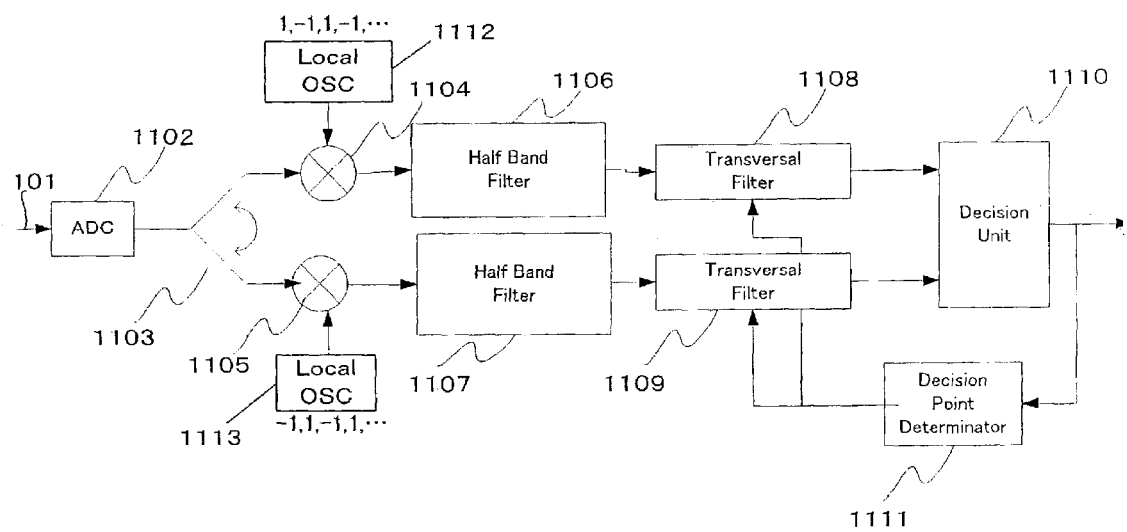
FIG. 10 is a block diagram of another demodulation apparatus in accordance with the fifth exemplary embodiment of the present invention.

As shown in FIG. 10, this sampling frequency can be reduced to the half by the known method. Its detail is omitted since it is publicly known and disclosed in a data sheet on HSP43216 of Intersil Corporation and the others. Its summary is as follows.

In FIG. 10, modulated wave 1101 having an intermediate frequency band undergoes sampling and quantisation in A/D converter 1102 and undergoes distributor 1103 to be alternately split into an in-phase (I) signal and a quadrature (Q) signal. The signals are multiplied by respective outputs of digital local oscillators 1112, 1113, respectively in multipliers 1104, 1105, the respective outputs of which undergo half-band filter 1106 comprising only even taps on the I signal side and half-band filter 1107 comprising only odd taps on the Q signal side, respectively, so that the speed of data is reduced to the half. Thereafter, the data undergo transversal filters 1108, 1109 and then undergo frequency error estimation, data decision and the others in decision unit 1110.

Decision point estimation unit 1111 estimates a decision point based on information output from decision unit 1110 and instructs filters 1108, 1109 to respectively prepare tap coefficients each designating the decision point. The outputs of local oscillators 1112, 1113 are a repetition of 1, −1 with respect to the I signal and a repetition of −1, 1 with respect to the Q signal. The combination of filter 1106 (1107) and filter 1108 (1109) is seemingly redundant, but a frequency at which a demodulation apparatus operates is halved.

Exemplary Embodiment 6

Figure 11:
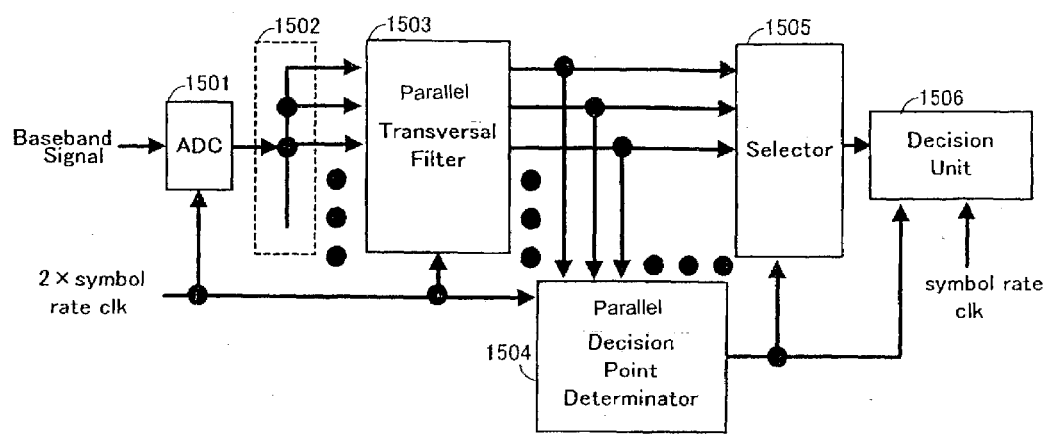
FIG. 11 is a block diagram of a demodulation apparatus in accordance with a sixth exemplary embodiment of the present invention.

FIG. 11 is a block diagram of a demodulation apparatus in accordance with the sixth exemplary embodiment of the present invention. The apparatus is comprised of A/D converter 1501, distributor 1502, parallel-structured transversal filter 1503, parallel-structured decision point determination unit 1504, selector 1505 and decision unit 1506.

A signal A/D converted by converter 1501 is split into a plurality of signals of the same kind by distributor 1502 and then input to a plurality of input terminals of transversal filter 1503, respectively. In consideration given to a fan-out, distributor 1502 requires a flip-flop or the like so that it can sufficiently drive the input of all of the signals to transversal filter 1503.

The following is an explanation of parallel-structured transversal filter 1503. To achieve impulse responses shown in FIG. 12, transversal filter 1503 is a parallel combination of structures each having tap coefficients, like those shown in FIG. 13. In the present embodiment illustrated by FIGS. 12 and 13, the number of structures in parallel is four, and filter 1503 performs decision on the signal, which is sampled by A/D converter 1501 at a rate twice as high as a symbol rate, with accuracy equivalent to eight-times oversampling. Each of the four structures of transversal filter 1503 is comprised of: delay circuits 1701–1705 in series; weighting circuits 1706–1711 for extracting signals from connection midpoints of circuits 1071–1705 and amplitude-regulating the signals; and adding circuit 1712 for adding respective outputs of weighting circuits 1706–1711. An output of adding circuit 1712 becomes an output signal of transversal filter 1503.

The change of the number of structures of the transversal filter 1503 allows transversal filter 1503 to perform decision with accuracy equivalent to 2×N-times oversampling (where N is a natural number representing the number of structures in parallel).

Here, the assumption is made that a channel filter on a transmitting side restricts a signal to a frequency band two or less times as high as the symbol rate. The A/D conversion at the sampling rate twice the symbol rate can thus satisfy the Nyquist theorem as well as the theory of upsampling. Through the use of, for example, a route roll-off filter as the channel filter for restricting the signal to the frequency band two or less times as high as the symbol rate, when a roll-off factor is 1.0, even the signal having a maximum frequency band is restricted to the frequency band twice the symbol rate, which situation is preferable. Transversal filter 1503, a channel filter on a receiving side, is also a route roll-off filter, and since its impulse responses are evenly symmetric with a maximum value being at its center, a group-delay response of transversal filter 1503 having these impulse responses sampled as the tap coefficients is flat, which situation is preferable.

Based on a plurality of signals simultaneously output from parallel-structured transversal filter 1503, an optimum decision point is determined. This is done by parallel-structured decision point determination unit 1504. The output signal that corresponds to a phase of the decision point determined is selected by selector 1505 from the output signals of transversal filter 1503 and then input to decision unit 1506.

Figure 14:
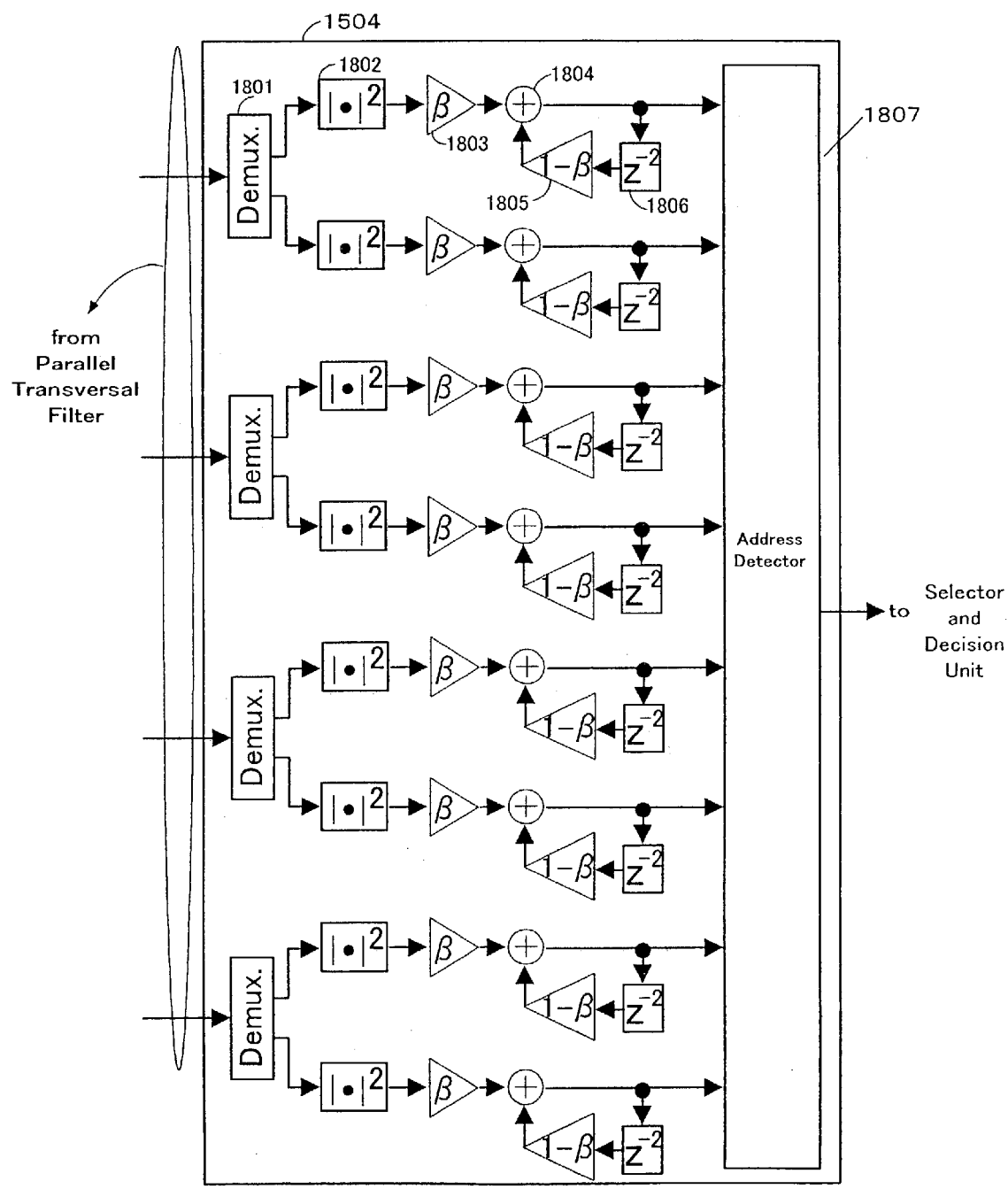
FIG. 14 is a block circuit diagram of a parallel-structured decision point determination unit of FIG. 11.

Decision point determination unit 1504 can have a structure, like the one shown in FIG. 14. Specifically, it is comprised of demultiplexers 1081, squaring units 1802, factor multipliers 1803, adders 1804, factor 1-multipliers 1805, delay circuits 1806 each delaying an output passing through circuit 1806 by a symbol cycle time, maximum value designating address detector 1807 and the others. Multipliers 1803, adders 1804, multipliers 1805, delay circuits 1806 and detector 1807 form a low pass filter. Each of the output signals of transversal filter 1503 is split by demultiplexer 1081. Each of the results split is squared by squaring unit 1802, multiplied by factor added to a value obtained by multiplying a cumulative value of delay circuit 1806 by factor 1-β. The result added accumulates in delay circuit 1806.

As shown in FIG. 14, the number of structures each being formed by demultiplexer 1801, two squaring units 1802, two multipliers 1803, two adders 1804, two multipliers 1805 and two delay circuits 1806 is prepared in parallel so as to be equal to the number of structures of parallel-structured transversal filter 1503. Among cumulative values of these structures that have accumulated to some symbols, maximum value designating address detector 1807 detects the cumulative value that is maximum. The thus-detected output signal of transversal filter 1503 is designated as the optimum decision point.

Figure 15:
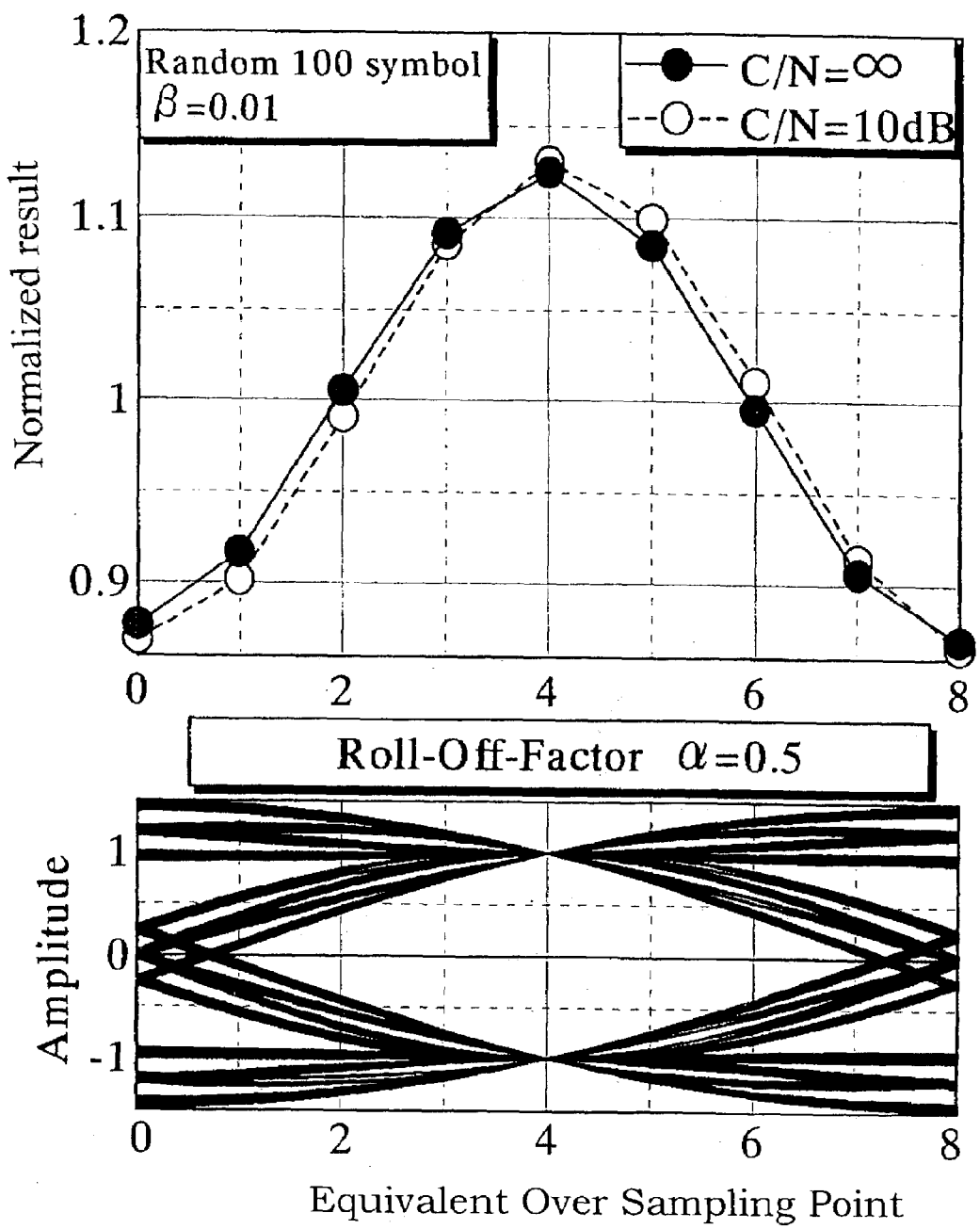
FIG. 15 is a waveform chart illustrating the result of a simulation performed by the parallel-structured decision point determination unit of FIG. 14.

FIG. 15 shows, as an example, the result of simulated values at respective phases that are input to detector 1807 when the values have accumulated to a hundred symbols, along with an eye diagram. In this case, roll-off factor α=0.5, factor β=0.01, and a random signal is input to the demodulation apparatus.

As shown in FIG. 15, a maximum value designates the optimum decision point (the phase with a maximum eye aperture ratio) not only when a carrier-to-noise ratio (C/N) is infinite but also when C/N=10 dB.

After maximum value designating address detector 1807 designates the maximum value as the decision point (address), selector 1505 selects the output signal of transversal filter 1503 that corresponds to the decision point designated, and the output signal selected undergoes decision unit 1506. Selector 1505 makes a selection by determining which of the output signals of transversal filter 1503 designates the address detected by detector 1807.

In other words, selector 1505 makes a selection by determining which of demultiplexers 1801 has the input signal corresponding to the address. Specifically, selector 1505 uses only two higher-order bits of the detected address for the selection in cases where the decision point having an effect equivalent to eight-times oversampling is desired. Since the signal of a rate twice the symbol rate is input from selector 1505 to decision unit 1506, decision unit 1506 makes a decision on the signal every second time.

As shown in FIG. 14, the decision point selected by detector 1807 is also input to decision unit 1506. This favorably facilitates decision as to which of the two times is a time suitable for the decision. Specifically, only the lowest-order bit of the address detected is used to select the time for the decision.

Figure 16:
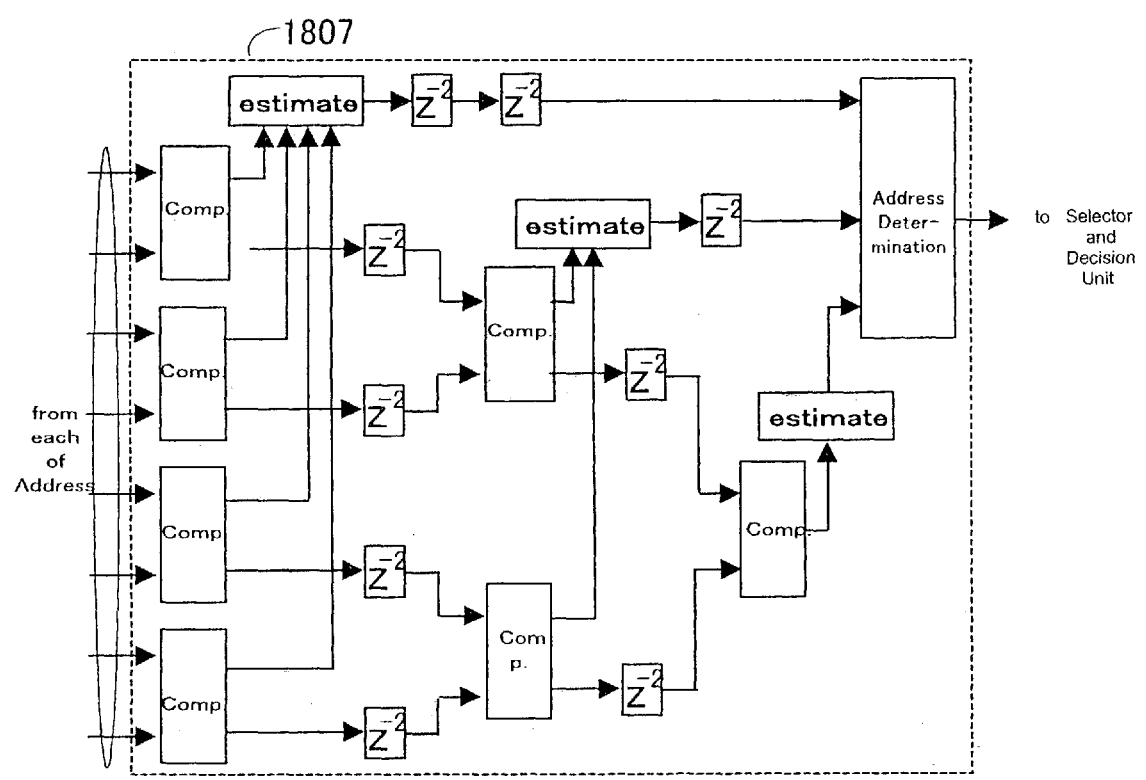
FIG. 16 is a block circuit diagram of a maximum value designating address detector of FIG. 14.

Maximum value designating address detector 1807 can detect the address, that is, the maximum value at the same clock rate as the prior stage and determine which of the output signals of transversal filter 1503 designates the optimum decision point, provided that it tolerates latency equivalent to some clocks. Detector 1807 includes a combination of a plurality of comparators shown in FIG. 16 to tolerate latency equivalent to three clocks. Detector 1807 can thus detect the decision point with accuracy equivalent to eight-times oversampling, while A/D converter 1501 and transversal filter 1503 at the subsequent stage of A/D converter 1501 are operated at the rate twice the symbol rate.

Figure 13:
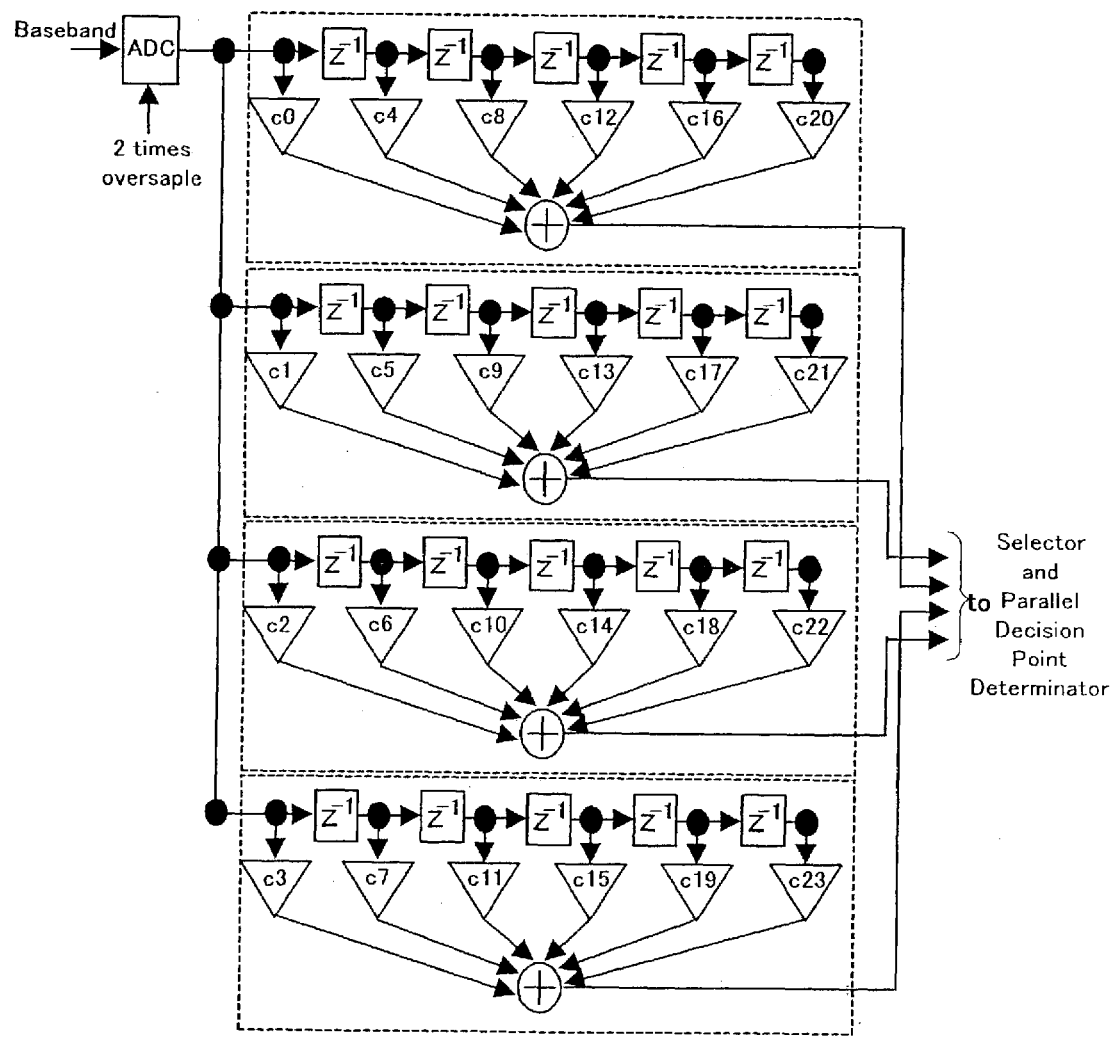
FIG. 13 is a block circuit diagram of a parallel-structured transversal filter of FIG. 11.
Figure 17:
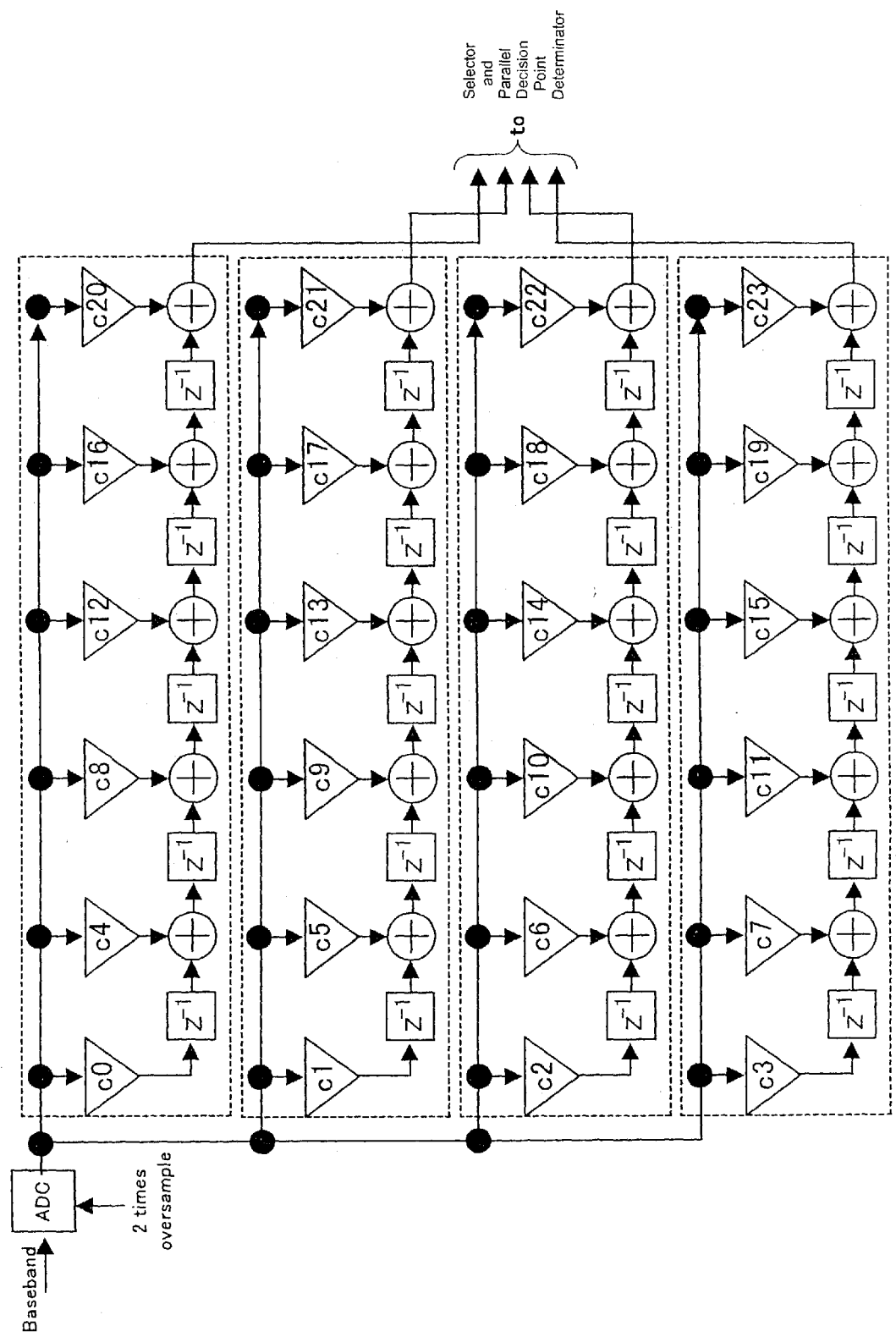
FIG. 17 is a block circuit diagram illustrating a transposed structure of the parallel-structured transversal filter of FIG. 11.

Other than the structure shown in FIG. 13, it is also preferable that parallel-structured transversal filter 1503 has, as shown in FIG. 17, a transposed structure in which weighting circuits 2101–2106 are connected in parallel, and respective outputs of weighting circuits 2101–2105 are delayed by delay circuits 2107–2111 and then accumulate in adding circuits 2112–2116, respectively.

Exemplary Embodiment 7

The seventh exemplary embodiment has the same block diagram (see FIG. 11) as that of the sixth exemplary embodiment. However, a clock rate required of parallel-structured transversal filter 1503, selector 1505 and parallel-structured decision point determination unit 1504 that are placed at the subsequent stage of A/D converter 1501 is the same as the symbol rate for the purpose of placing demultiplexers at the subsequent stage of A/D converter 1501 thereby to reduce the operation speed of transversal filter 1503 in half. The detailed structure is shown FIG. 18.

Figure 12:
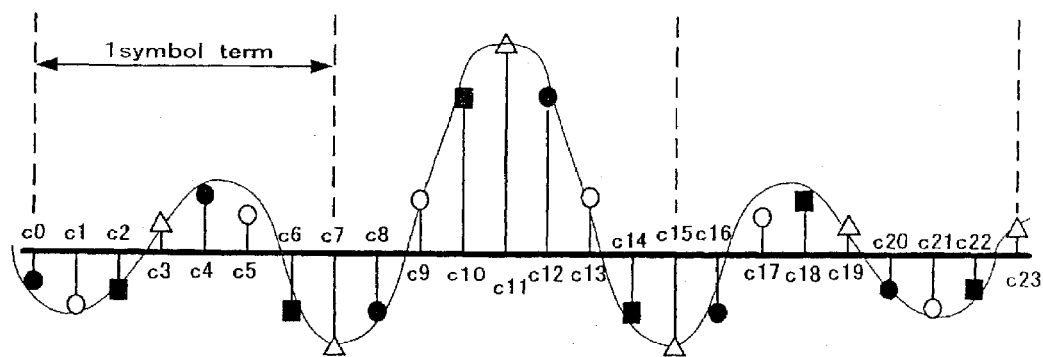
FIG. 12 is a waveform chart of impulse responses for explaining the operation in accordance with the sixth exemplary embodiment of the present invention.
Figure 18:
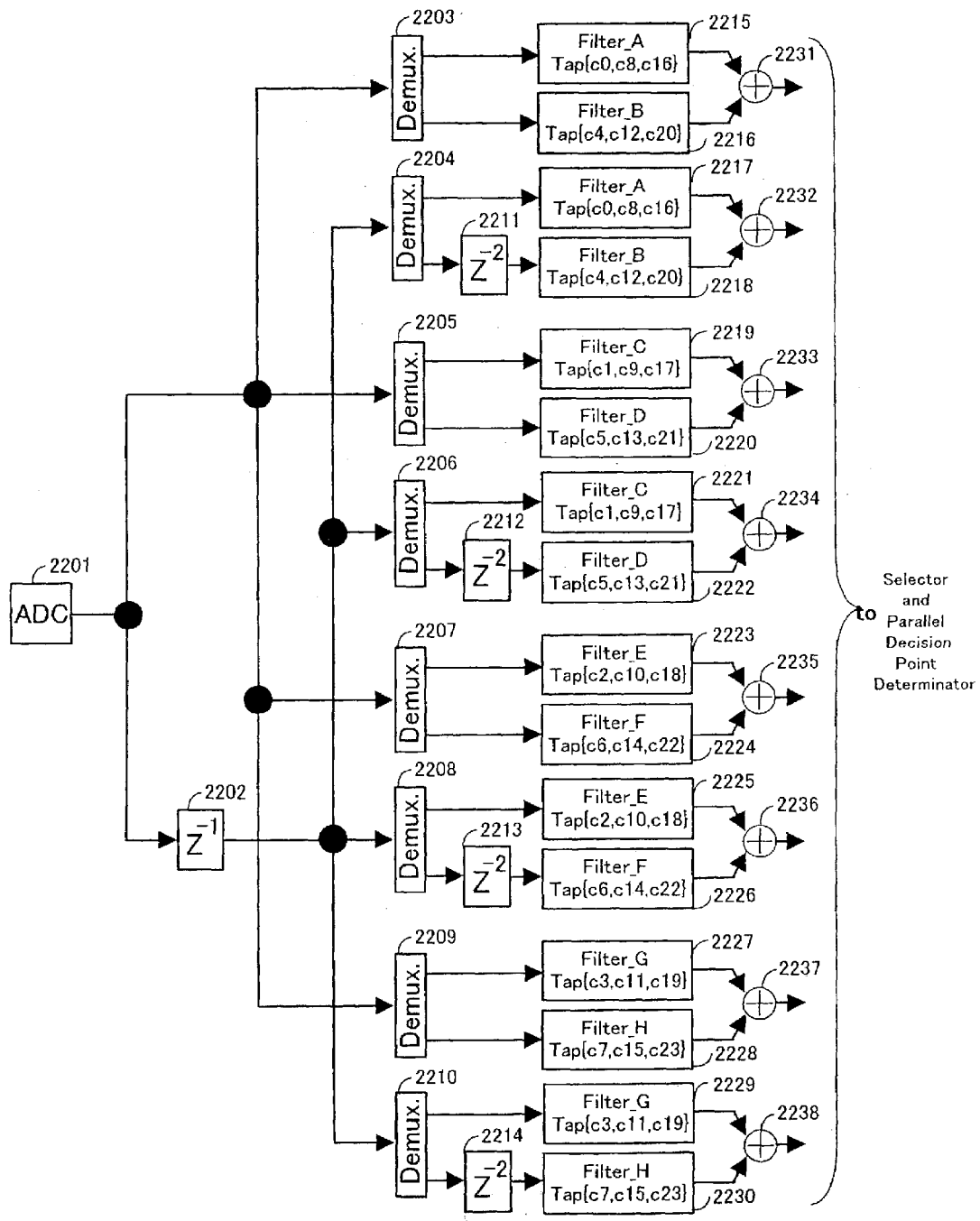
FIG. 18 is a block circuit diagram of the parallel-structured transversal filter in accordance with a seventh exemplary embodiment of the present invention.

FIG. 18 shows transversal filter 1503 that performs decision of decision points from a signal, which is sampled by A/D converter 2201 at a rate twice as high as a symbol rate, with accuracy equivalent to eight-times oversampling for the purpose of achieving impulse responses, like those of FIG. 12.

The baseband signal converted by A/D converter 2201 is split into two, with one being delayed by an A/D conversion sampling time (half a symbol cycle time) in delay circuit 2202, split into four outputs and fed to demultiplexers 2204, 2206, 2208, 2210, respectively and the other being split into four outputs without being delayed and fed to demultiplexers 2203, 2205, 2207, 2209, respectively.

After demultiplexers 2203, 2205, 2207, 2209 split the four outputs into two outputs, respectively, the resulting outputs are fed to transversal filters 2215, 2216, 2219, 2220, 2223, 2224, 2227, 2228, respectively. Respective outputs of transversal filters 2215, 2216 are added together by adder 2231. Similarly, respective outputs of transversal filters 2219, 2220, respective outputs of transversal filters 2223, 2224 and respective outputs of transversal filters 2227, 2228 are added together by adders 2233, 2235, 2237, respectively.

The other demultiplexers 2204, 2206, 2208, 2210 split the four outputs into two outputs, respectively, and some of the resulting outputs are fed to transversal filters 2217, 2221, 2225, 2229, while the other resulting outputs are delayed by a time twice the A/D conversion sampling time, that is, the symbol cycle time in delay circuits 2211, 2212, 2213, 2214 and fed to transversal filters 2218, 2222, 2226, 2230, respectively. Respective outputs of transversal filters 2217, 2218 are added together by adder 2232. Similarly, respective outputs of transversal filters 2221, 2222, respective outputs of transversal filters 2225, 2226 and respective outputs of transversal filters 2229, 2230 are added together by adders 2234, 2236, 2238, respectively.

Figure 19:
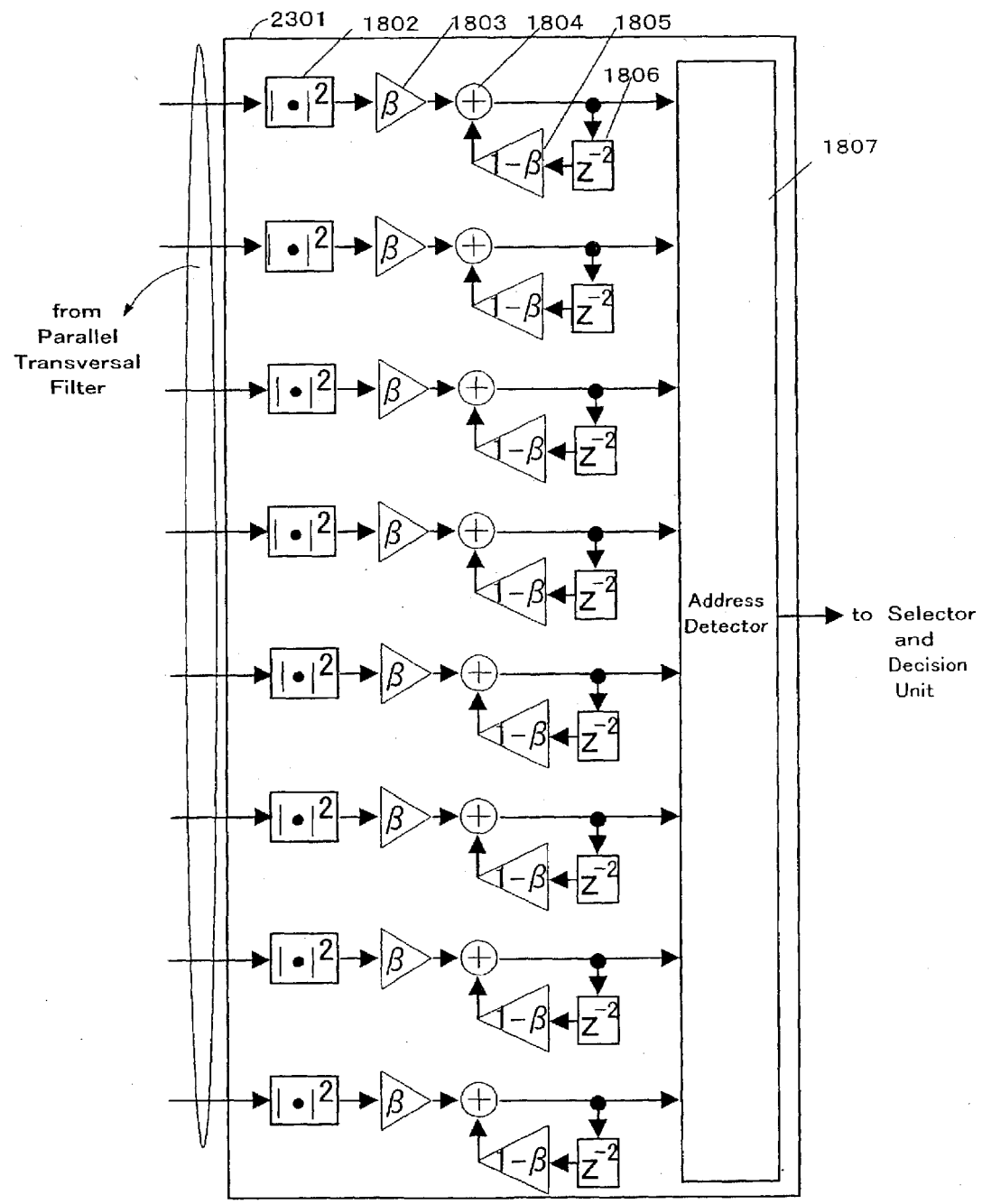
FIG. 19 is a block circuit diagram illustrating another structure of the parallel-structured decision point determination unit of FIG. 11.

Respective outputs of adders 2231–2238 are input to selector 1505, like the one shown in FIG. 11, and parallel-structured decision point determination unit 2301 shown in FIG. 19.

The number of inputs to selector 1505 and determination unit 2301 needs to be doubled compared with that of the case of FIG. 11, while the speed at which selector 1505 and determination unit 2301 operate may be half the operation speed of the case shown in FIG. 11. Parallel-structured decision point determination unit 2301 of FIG. 19 has the same structure as that of FIG. 14 except that it has no demultiplexer 1801. Decision unit 1506 placed at the subsequent stage of selector 1505 differs from that of the sixth embodiment in that a signal input thereto is of a rate coinciding with the symbol rate, so that decision unit 1506 needs to make a decision every time.

To achieve the impulse responses, like those shown in FIG. 12, parallel-structured transversal filter 1503 comprises: filters 2215, 2217 each having a group of tap coefficients c0, c8, c16; filters 2216, 2218 each having a group of tap coefficients c4, c12, c20; filters 2219, 2221 each having a group of tap coefficients c1, c9, c17; filters 2220, 2222 each having a group of tap coefficients c5, c13, c21; filters 2223, 2225 each having a group of tap coefficients c2, c10, c18; filters 2224, 2226 each having a group of tap coefficients c6, c14, c22; filters 2227, 2229 each having a group of tap coefficients c3, c11, c19; and filters 2228, 2230 each having a group of tap coefficients c7, c15, c23. In other words, the tap coefficients in each of the coefficient strings of transversal filter 1503 in accordance with the sixth embodiment are alternately included in separate filters, so that the speed required for the multiplication is halved, and through the addition of the results multiplied, the same response as that of the sixth embodiment can be obtained.

In the present embodiment, only A/D converter 2201 performs sampling at the rate twice the symbol rate, and subsequent demultiplexers 2203–2210 operate at the clock rate equal to the symbol rate.

It is also preferable that parallel-structured transversal filter 1503 constructed in accordance with the present embodiment has a transposed structure, like the one shown in FIG. 17, in place of the structure shown in FIG. 13.

Figure 23:
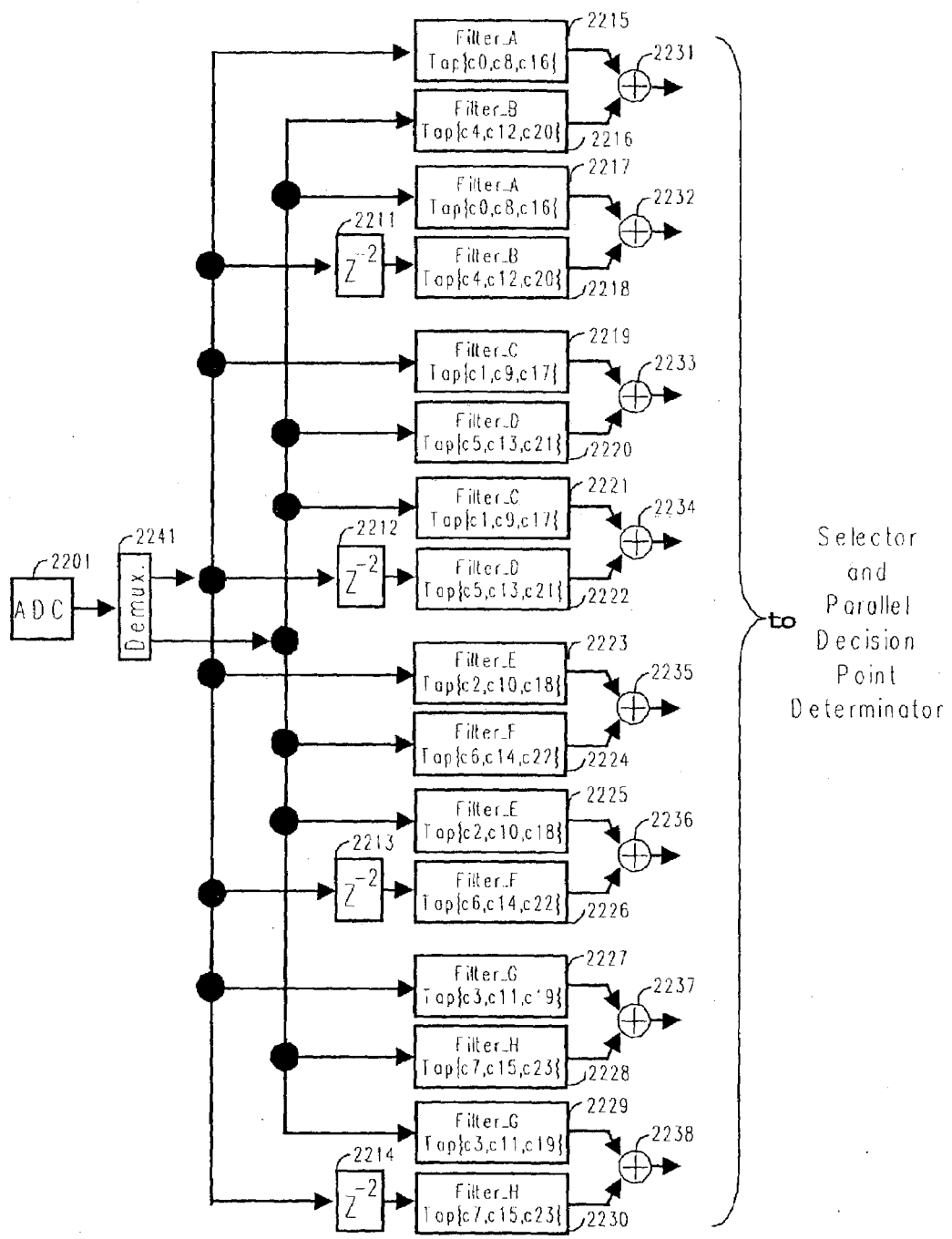
FIG. 23 is a block circuit diagram of another parallel-structured transversal filter in accordance with the seventh exemplary embodiment of the present invention.

FIG. 23 shows another type of transversal filter 1503 which simplifies the block circuit diagram of FIG. 18. In FIG. 23, the same numerals refer to the same elements of FIG. 18.

The baseband signal converted by A/D converter 2201 is fed to demultiplexer 2241 to be demultiplexed into two. One output of demultiplexer 2241 is split into M outputs, where M is an integer equal to or greater than 2. In FIG. 23, M=8. M/2 (=4) outputs of the M(=8) outputs are fed to transversal filters 2215, 2219, 2223, 2227, respectively, and the remaining M/2 (=4) outputs are fed to transversal filters 2218, 2222, 2226, 2230 via delay circuits 2211, 2212, 2213, 2214, respectively. Another output of the demultiplexer 2241 is also split into M(=8) outputs and are fed to transversal filters 2216, 2217, 2220, 2221, 2224, 2225, 2228, 2229, respectively.

Respective outputs of transversal filters 2215, 2216 are added together by adder 2231. Similarly, respective outputs of transversal filters 2217, 2218; respective outputs of transversal filters 2219, 2220; respective outputs of transversal filters 2221, 2222; respective outputs of transversal filters 2223, 2224; respective outputs of transversal filters 2225, 2226; respective outputs of transversal filters 2227, 2228; and respective outputs of transversal filters 2229, 2230 are added together by adders 2232, 2233, 2234, 2235, 2236, 2237 and 2238, respectively.

Respective outputs of adders 2231–2238 are input to selector 1505, like the one shown in FIG. 11, and parallel-structured decision point determination unit 2301 shown in FIG. 19.

The example of FIG. 23 simplifies the block circuit diagram of FIG. 18 by reducing demultiplexers.

Exemplary Embodiment 8

Figure 20:
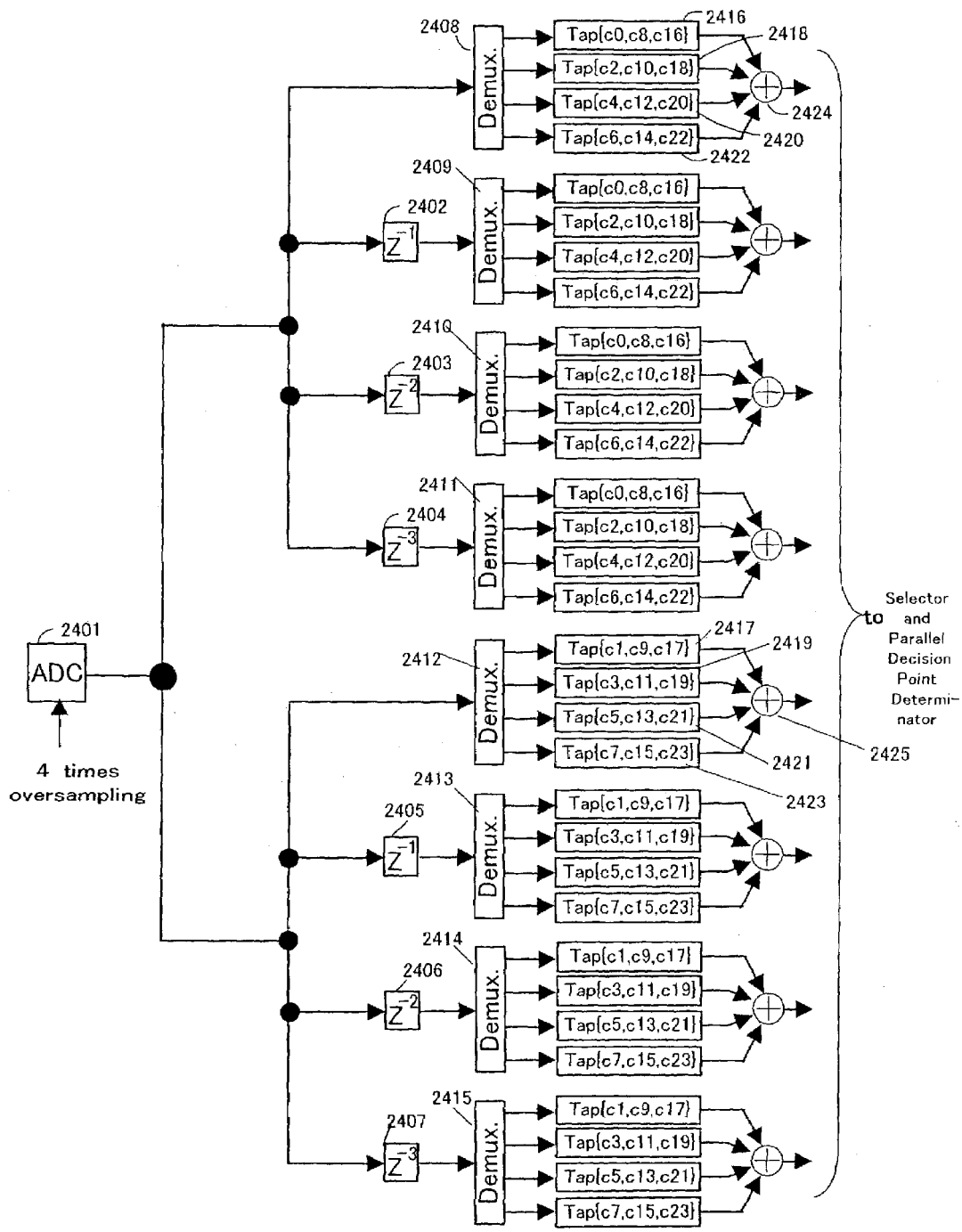
FIG. 20 is a block circuit diagram of a parallel-structured transversal filter in accordance with an eighth exemplary embodiment of the present invention.

The eighth exemplary embodiment utilizes the same principle as that of the seventh exemplary embodiment, and is a case where a sampling rate of an A/D converter is N times as high as a symbol rate where N is a natural number equal to or greater than 2. FIG. 20 shows one example of a structure achieving impulse responses, like those of FIG. 12, when N=4.

The structure illustrated by FIG. 20 is comprised of: A/D converter 2401, the sampling rate of which is four times as high as the symbol rate; delay circuits 2402–2407; demultiplexers 2408–2415; transversal filters 2416 each having a group of tap coefficients c0, c8, c16; transversal filters 2417 each having a group of tap coefficients c1, c9, c17; transversal filters 2418 each having a group of tap coefficients c2, c10, c18; transversal filters 2419 each having a group of tap coefficients c3, c11, c19; transversal filters 2420 each having a group of tap coefficients c4, c12, c20; transversal filters 2421 each having a group of tap coefficients c5, c13, c21; transversal filters 2422 each having a group of tap coefficients c6, c14, c22; transversal filters 2423 each having a group of tap coefficients c7, c15, c23; and adders 2424, 2425. Demultiplexers 2408–2415 demultiplexes one signal into four signals.

A baseband signal A/D converted by converter 2401 is split into eight outputs. Some of the outputs are delayed by an A/D conversion sampling time (half a symbol cycle time) in delay circuits 2402–2407 and fed to demultiplexers 2409–2411 and 2413–2415, respectively. Demultiplexers 2409–2411 split respective outputs of delay circuits 2402–2404 into four outputs, respectively, and the four outputs of each of demultiplexers 2409–2411 are fed to transversal filters 2416, 2418, 2420, 2422, respectively. Demultiplexers 2413–2415 split respective outputs of delay circuits 2405–2407 into four outputs, respectively, and the four outputs of each of demultiplexers 2413–2415 are fed to transversal filters 2417, 2419, 2421, 2423, respectively. Respective outputs of transversal filters 2416, 2418, 2420, 2422 are added together by adder 2424, while respective outputs of transversal filters 2417, 2419, 2421, 2423 are added together by adder 2425.

The other outputs of A/D converter 2401 that do not undergo delay circuits 2402–2407 are fed to demultiplexers 2408, 2412, respectively. Demultiplexer 2408 splits the output into four outputs, which are fed to transversal filters 2416, 2418, 2420, 2422, respectively and added together by adder 2424, while demultiplexer 2412 splits the output into four outputs, which are fed to transversal filters 2417, 2419, 2421, 2423, respectively and added together by adder 2425.

Through the preparation of the respective tap coefficient groups of transversal filters 2416–2423 in the same manner as the seventh embodiment and the parallel arrangement of a plurality of filters 2416–2423 each having phase-shifted tap coefficients, a demodulation apparatus capable of performing decision with accuracy equivalent to an arbitrary oversampling number can be realized, with only the sampling rate of A/D converter 2401 being high, while processing of the signal at the subsequent stage thereof being carried out at the symbol rate.

As described above, the demodulation apparatus for the digital modulated wave according to the present invention can perform demodulation equivalent to the arbitrary oversampling number while keeping the increase of the clock frequency, which is required when receiving a broadband signal, to a bare minimum and delivers high performance even when an interference signal is present in the vicinity of the broadband signal.

Figure 24:
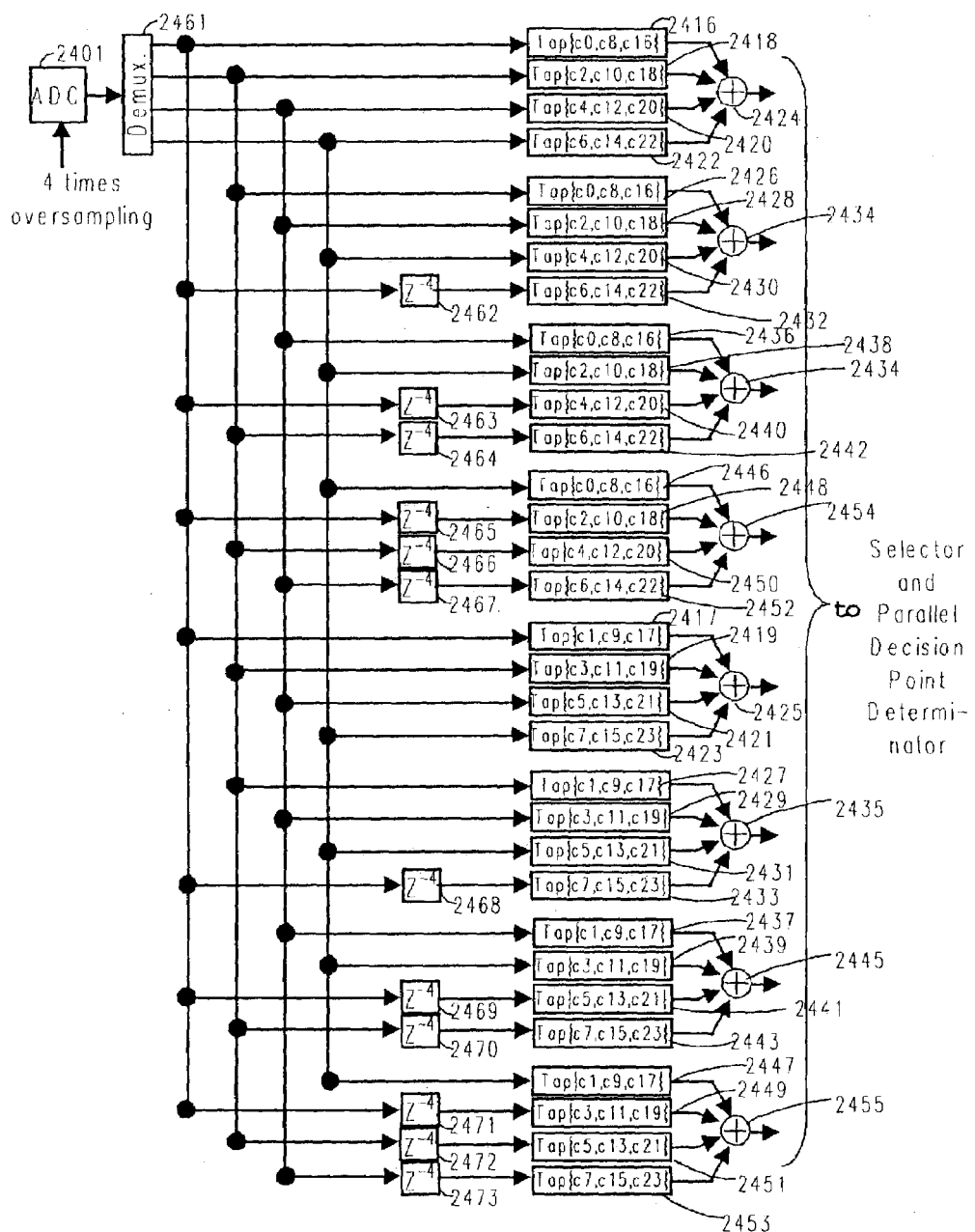
FIG. 24 is a block circuit diagram of another parallel-structured transversal filter in accordance with the eighth exemplary embodiment of the present invention.

FIG. 24 shows another example which simplifies the block circuit diagram of FIG. 20. In FIG. 24, the same numerals refer to the same elements of FIG. 20.

An A/D converter 2401 samples a baseband signal with a sampling rate of N times as high as the symbol rate, where N is an integer equal to or greater than 2. In FIG. 23, N=4. The output signal of the A/D converter 2401 is fed to demultiplexer 2461 to be demultiplexed into N (=4) outputs.

A first output of the N outputs of the demultiplexer 2461 are split into 2N(=8) outputs; two of which are fed to transversal filters 2416 and 2417, respectively, and each of the remaining six outputs is fed to transversal filters 2432, 2440, 2448, 2433, 2441, 2449 via delay circuits 2462, 2463, 2465, 2468, 2469, 2471, respectively.

A second output of the N outputs of the demultiplexer 2461 is also split into 2N(=8) outputs, each of four of which is fed to transversal filters 2418, 2426, 2419, 2427, respectively, and each of the remaining four outputs is fed to transversal filters 2442, 2450, 2443, 2451 via delay circuits 2464, 2466, 2470, 2472, respectively.

A third output of the N outputs of the demultiplexer 2461 is also split into 2N(=8); each of six of which is fed to transversal filters 2420, 2428, 2436, 2421, 2429, 2437, respectively, and each of the remaining two outputs is fed to transversal filters 2452, 2453 via delay circuits 2467, 2473, respectively. Each of the delay circuits 2462–2473 delays signals by an A/D conversion sampling time (half a symbol cycle time).

A fourth output of the N outputs of the demultiplexer 2461 is also split into 2N(=8), each of which is fed to a transversal filter 2422, 2430, 2438, 2446, 2423, 2431, 2439, 2447, respectively.

The delay circuits 2462–2473 are provided with a number of N(N−1) when total split number is N×2N.

Respective outputs of transversal filters 2416, 2418, 2420, 2422 are added together by adder 2424. In the same manner, respective outputs of transversal filters 2426, 2428, 2430, 2432 are added together by adder 2434; respective outputs of transversal filters 2436, 2438, 2440, 2442 are added together by adder 2444; and respective outputs of transversal filters 2446, 2448, 2450, 2452 are added together by adder 2454. Respective outputs of transversal filters 2417, 2419, 2421, 2423 are added together by adder 2425. In the same manner, respective outputs of transversal filters 2427, 2429, 2431, 2433 are added together by adder 2435; respective outputs of transversal filters 2437, 2439, 2441, 2443 are added together by adder 2445; and respective outputs of transversal filters 2447, 2449, 2451, 2453 are added together by adder 2455.

The example of FIG. 24 simplifies the block circuit diagram of FIG. 20 by reducing demultiplexers.

Exemplary Embodiment 9

Figure 21:
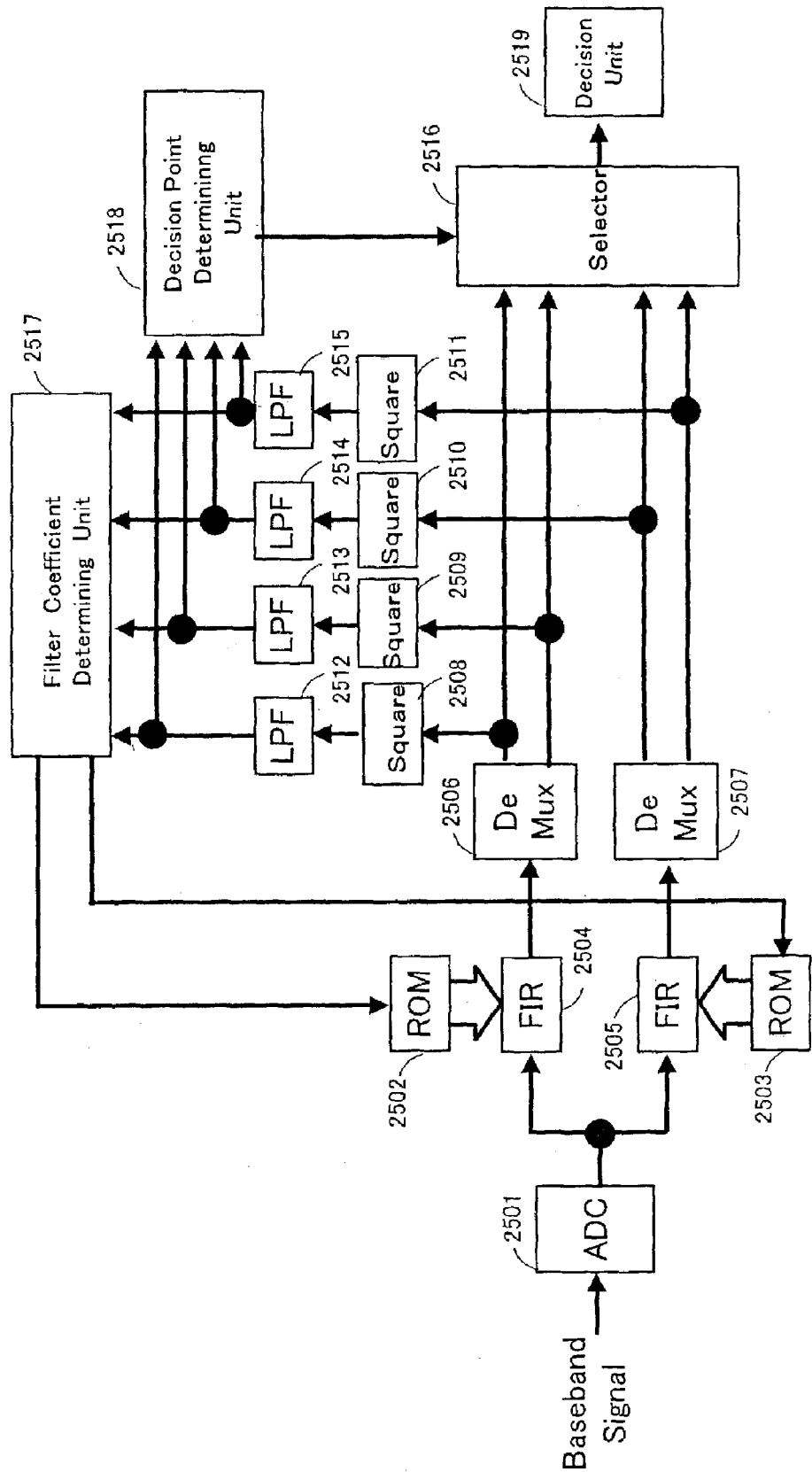
FIG. 21 is a block diagram of a demodulation apparatus in accordance with a ninth exemplary-embodiment of the present invention.

FIG. 21 shows exemplary embodiment 9 of the present invention. The demodulation apparatus essentially comprises an AD converter 2501, filter coefficient memories 2502, 2503 each of which stores filter coefficients for designating tap coefficients of transversal filters 2504, 2505 respectively, demultiplexers 2506, 2507, square circuits 2508–2511 connected to output terminals of the demultiplexers 2506, 2507, low pass filters 2512–2515 each of which is connected to outputs of the square circuits 2508–2511, a selector 2516 connected to the outputs of the demultiplexers 2506, 2507, a filter coefficient determining unit 2517 connected to outputs of the low pass filters 2512–2515, a decision point determining unit 2518 connected to other outputs of the low pass filters 2512–2515, and a decision unit 2519.

A baseband signal inputted to the AD converter 2501 is converted into digital signal and divided into two signals. One of which is is inputted to a transversal filter 2504 and another is inputted to a transversal filter 2505. A filter coefficient of the transversal filter 2504 is settled to a sampling values for designating sampling points {a0, j0, a1, j1, . . . } of FIG. 22 as a initial condition, while a filter coefficient of the transversal filter 2505 is settled to a sampling values for designating {e0, m0, e1, m1, . . . } of FIG. 22 as a initial condition. The sampling points {e0, m0, e1, m1, . . . } correspond to points by shifting phases of the {a0, j0, a1, j1, . . . } with 90 degrees. Output signals of the transversal filters 2504, 2505 are demultiplexed by the demultiplexers 2506, 2507 and supplied to the selector 2516. The output signals of the demultiplexers 2506, 2507 are also supplied to the square circuits 2508–2511. Each of the outputs of the square circuits 2508–2511 are supplied to the low pass filters 2512–2515, respectively. Each of the low pass filter 2512–2515 is designed to cumulate inputted data thereto during a predetermined time and reset them after elapsed the predetermined time.

The cumulated output signal of each of the low pass filters 2512–2515 is supplied to the filter coefficient determining unit 2517 and the decision point determining unit 2518 respectively. The decision point determining unit 2518 detects an address showing a maximum value of four output signals of the low pass filters 2512–2515, and the address is noticed to the selector 2516. The selector selects one output signal, which is obtained from the signal pass having the address noticed by the decision point determining unit 2518, of the output signals of the demultiplexers 2506, 2507. The selected signal is supplied to the decision unit 2519 and decides data contents such as data position on I–Q coordinates.

Figure 22:
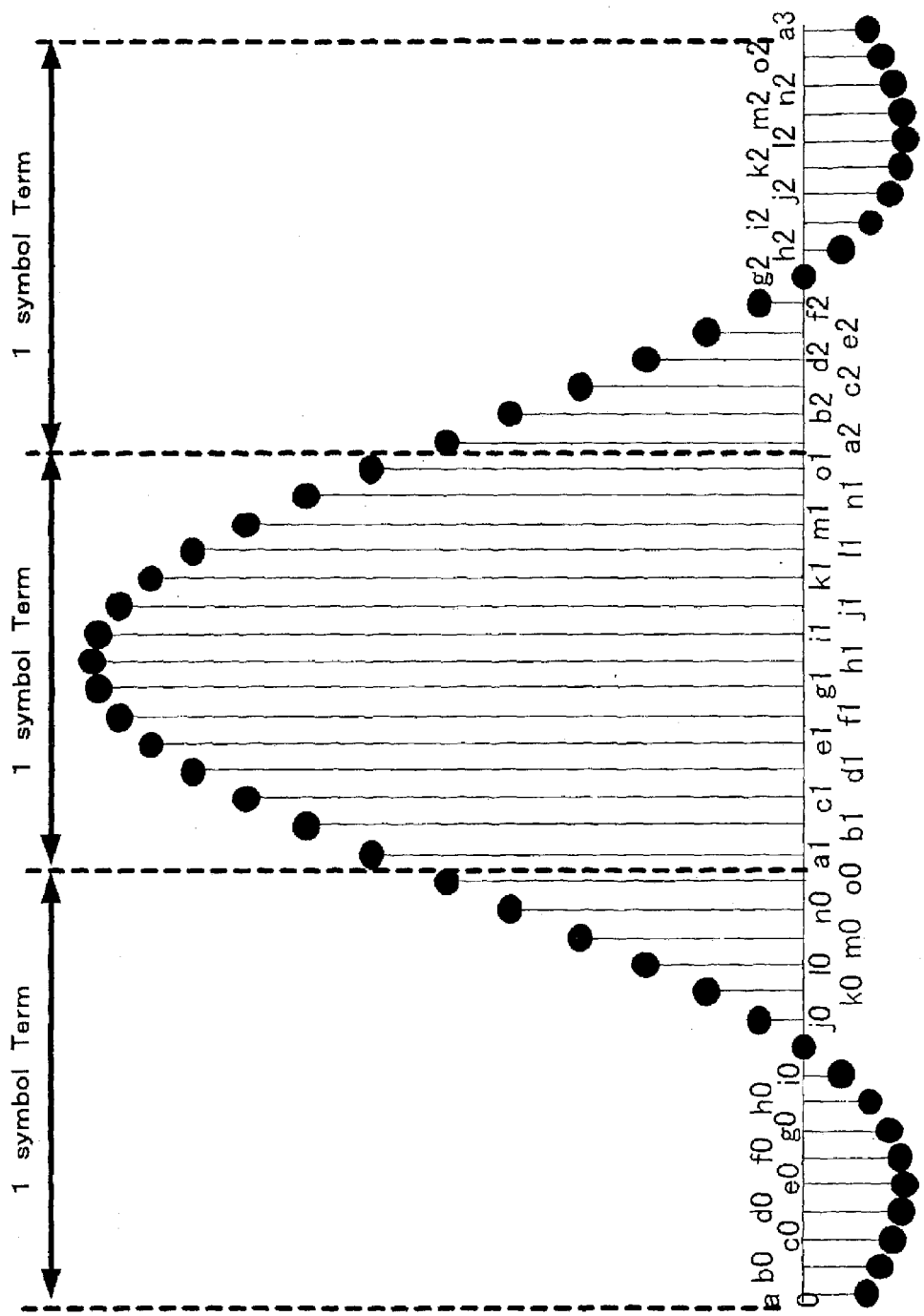
FIG. 22 is a waveform chart of impulse responses for explaining the operation in accordance with the ninth exemplary embodiment of the present invention.

The filter coefficient determining unit 2517 also detects the address before resetting the low pass filter 2512–2515, and gives information to the filter coefficient memories 2502, 2503 to select a tap coefficient group which corresponds to points by shifting phase with ±45 degrees from the phase corresponding to the detected address. For example, if the output corresponding to phase e of FIG. 22 is a maximum value, the tap coefficients group {c0, k0, c1, k1, . . . }, which are shifted with −45 degrees from the phase e0, and {0, o0, g1, o1, . . . }, which are shifted with +45 degrees from the phase e0, are selected.

In second stage, the filter coefficient determining unit 2517 detects second stage address showing second stage maximum value of four output signals of the low pass filters 2512–2515 before resetting the low pass filter 2512–2515, and gives second stage information to the filter coefficient memories 2502, 2503 to select a tap coefficient group which corresponds to points by shifting phase with ±45/2 degrees from the phase corresponding to the second stage address. For example, if the output corresponding to phase g is a maximum value, the tap coefficients group {f0, n0, f1, n1, . . . } and {h0, p0, h1, p1, . . . } are selected.

In third stage, the filter coefficient determining unit 2517 detects third stage address showing third stage maximum value of four output signals of the low pass filters 2512–2515 before resetting the low pass filter 2512–2515, and gives third stage information to the filter coefficient memories 2502, 2503 to select a tap coefficient group which corresponds to points by shifting phase with +45/4 degrees or −45/4 degrees from the phase corresponding to the third stage address. The selection of +45/4 degrees or −45/4 degrees is performed in same probability. For example, if the output corresponding to phase f is a maximum value, the tap coefficients group {f0, n0, f1, n1, . . . } and {e0, m0, e1, m1, . . . } are selected. In next stage, if the output corresponding to phase f is a maximum value again, the tap coefficients group {f0, n0, f1, n1, . . . } and {g0, o0, g1, o1, . . . } are selected.

What is claimed is:

1. A demodulation apparatus comprising:
an A/D converter for sampling and quantizing a baseband signal;
a demultiplexer for multiple-separating output signal of said A/D converter into two outputs;
a first branch unit for splitting one of said two outputs of the demultiplexer into M outputs, where M is an integer equal to or greater than 2;
M/2 delay units for delaying M/2 outputs of said first branch unit;
a second branch unit for splitting the other outputs of the demultiplexer into M;
first M/2 transversal filters, each of which receives each output of the first branch unit as it is;
second M/2 transversal filters, each of which receives output of each of the M/2 delay units;
third M transversal filters, each of which receives each output of the second branch unit as it is;
first M/2 adders, each of which adds one of the output signals of the first transversal filters and one of the output signals of the third transversal filters;
second M/2 adders, each of which adds one of the output signals of the second transversal filters and one of the output signals of the third transversal filters;
a parallel-structured decision point determination unit for selecting one output from respective outputs of the first M/2 adders and second M/2 adders;
a selector for outputting only the output of the adder that is selected by the parallel-structured decision point determination unit to a subsequent stage thereof; and
a decision unit for making a decision on the output of the selector.

2. A demodulation apparatus comprising:
an A/D converter for sampling and quantizing a baseband signal at a sampling rate N-times as high as a symbol rate, where N is an integer equal to or greater than 2;
a demultiplexer for multiple-separating output signal of said A/D converter into N outputs;
N branch units for splitting each of the outputs of the A/D converter into 2N outputs;
N(N−1) delay units for delaying N(N−1) outputs of the N×2N outputs of the branch unit;
a parallel-structured transversal filter having 2N×N transversal filters in parallel for receiving non-delayed N×2N−N(N−1) outputs and delayed N(N−1) outputs of the N×2N outputs of the branch unit, respectively;
2N adders, each of which adds every N outputs of the parallel-structured transversal filter;
a parallel-structured decision point determination unit for selecting one output from respective outputs of the 2N adders;
a selector for outputting only the output of the adder that is selected by the parallel-structured decision point determination unit to a subsequent stage thereof; and
a decision unit for making a decision on the output of the selector.

* * * * *

UNITED STATES PATENT AND TRADEMARK OFFICE
CERTIFICATE OF CORRECTION

PATENT NO.         : 7,116,730 B2                                    Page 1 of 1
APPLICATION NO.    : 10/394346
DATED              : October 3, 2006
INVENTOR(S)        : Yoshinori Kunieda It is certified that error appears in the above-identified patent and that said Letters Patent is hereby corrected as shown below:

Cover Page, Item (75) Inventors
Change "Yoshinori Kunleda" to -- Yoshinori Kunieda --

Signed and Sealed this

Sixth Day of February, 2007

JON W. DUDAS
*Director of the United States Patent and Trademark Office*